United States Patent
Lee

(10) Patent No.: US 6,967,316 B2
(45) Date of Patent: Nov. 22, 2005

(54) METHOD FOR FABRICATING IMAGE SENSOR INCLUDING ISOLATION LAYER HAVING TRENCH STRUCTURE

(75) Inventor: Won-Ho Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 277 days.

(21) Appl. No.: 10/616,721

(22) Filed: Jul. 10, 2003

(65) Prior Publication Data

US 2005/0176167 A1    Aug. 11, 2005

(30) Foreign Application Priority Data

Dec. 27, 2002    (KR) .................. 10-2002-0085164

(51) Int. Cl.[7] .............................................. H01L 27/00
(52) U.S. Cl. .................................. 250/208.1; 250/239
(58) Field of Search ........................... 250/208.1, 239, 250/214 R, 214.1; 257/291, 292, 324, 348, 257/440; 438/207, 248, 270

(56) References Cited

U.S. PATENT DOCUMENTS 6,184,055 B1 * 2/2001 Yang et al. .................... 438/57

OTHER PUBLICATIONS

Fujieda et al., "Dependence of Si PH Junction Perimeter Leakage on the Channel-Stop Boron Dose and Interlayer Material," *IEEE Electron Device Letters, vol. 20, No. 8*, 418-420 (Aug. 1999).
Morris et al., "An Accurate and Efficient Model for Boron Implants through Thin Oxide Layers into Single-Crystal Silicon," *IEEE Transactions on Semiconductor Manufacturing 8(4,)* 408-413 (Nov. 1995).
Son et al., "Blanket Tilt Implanted Shallow Trench Isolation (BTI0STI) Process for Enhanced Dram Retention Time Characteristics," IEEE 122-124 (1999).
Walther et al., "Dopant Channeling as a Function of Implant Angle for Low Energy Applications," IEEE 126-129 (1999).

* cited by examiner

*Primary Examiner*—Que T. Le
(74) *Attorney, Agent, or Firm*—Marshall, Gerstein & Borun LLP

(57) ABSTRACT

The present invention relates to a method for fabricating an image sensor including a device isolation layer having a trench structure. Particularly, an implantation process is performed twice to form two channel stop ion implantation regions in the course of forming the device isolation layer so that a cross-talk phenomenon between neighboring unit pixels is reduced and a leakage current is improved.

6 Claims, 5 Drawing Sheets

METHOD FOR FABRICATING IMAGE SENSOR INCLUDING ISOLATION LAYER HAVING TRENCH STRUCTURE

RELATED APPLICATION DATA

This application claims the benefit of foreign priority under 35 U.S.C. §119 of Korean patent application number 2002-0085164 filed Dec. 27, 2002.

FIELD OF THE INVENTION

The present invention relates to an image sensor; and, more particularly, to a method for fabricating an image sensor including a device isolation layer having a trench structure capable of preventing a cross-talk phenomenon between neighboring pixels, decreasing leakage currents and improving dark currents.

DESCRIPTION OF RELATED ART

Generally, image sensor is a semiconductor device converting an optical image into an electric signal. Particularly, a charge coupled device (CCD) is a device including a plurality of metal-oxide-silicon (hereinafter referred as to MOS) capacitors closely located to each other and a charge carrier stored into the MOS capacitor and transferred to another device. A complementary metal oxide semiconductor (hereinafter referred to as CMOS) image sensor is a device that makes MOS transistors as the same number of existing pixels by employing a CMOS technology that uses a control circuit and a signal processing circuit as periphery circuits and adopts a switching mode detecting outputs sequentially.

There are several problems in using the CCD due to its complex driving mode, high power dissipation, a complex process having lots of steps for a mask process and a difficulty in one chip realization owing to the fact that the signal processing circuit cannot be constructed on a CCD chip. Therefore, there has been actively researched on the CMOS image sensor that uses a sub-micron CMOS technology to overcome the above problems. The CMOS image sensor obtains an image by forming a photodiode and a MOS transistor in a unit pixel and then detecting signals sequentially through a switching mode. The use of the CMOS technology results in less power dissipation and an enabled one chip process for the signal processing circuit. Also, compared to the CCD process that requires approximately 30 to 40 masks, the CMOS image sensor implemented with the CMOS technology needs approximately 20 masks because of a simplified process. Hence, the CMOS image sensor is currently highlighted as a next generation image sensor.

FIG. 1A is a circuit diagram showing an unit pixel of a CMOS image sensor constituted with one photodiode (PD) and four n-type MOS transistors. The Photodiode (PD) generates optical charges after receiving light. The four n-type MOS transistors are a transfer transistor Tx for transferring optical charges collected at the photodiode to a floating diffusion (FD) region, a reset transistor Rx for setting an electrical potential of the floating diffusion (FD) region in a preferable level and resetting the floating diffusion (FD) region after discharging charges, a drive transistor Dx for functioning as a source follower buffer amplifier and a select transistor Sx for performing a switching function to address the pixel. Also, a load transistor (not shown) for reading an output signal is formed outside of the unit pixel.

It is a current trend that the above type of the CMOS image sensor is increasingly micronized and minimized. For instance, a minimum line width of a circuit used in the CMOS image sensor is decreased from about 0.5 $\mu$m to about 0.3 $\mu$m. Furthermore, there are vigorous studies on the development of 0.18 $\mu$m devices.

The micronization of the image sensor causes a size of each unit pixel and a distance between the neighboring pixels to be decreased, and thus, a driving voltage for driving the circuit is also decreased.

The photodiode is installed in the unit pixel of the image sensor. Thus, if the unit pixel size is decreased, the photodiode size is also proportionally decreased. The Photodiode is a device for reproducing an image by storing optical charges into a depletion region. Particularly, an amount of optical charges generated by the light is directly related to a dynamic range of the image sensor.

The dynamic range is a magnitude of variations in a maximum output of the image sensor. The higher dynamic range means the more accurately reproduced image.

There are several methods for increasing the dynamic range of the image sensor. One method is to decrease a capacitance of the floating diffusion region. The optical charges generated at the photodiode region are transferred to the floating diffusion region so as to be used for reproducing an image. At this time, the lower the capacitance of the floating diffusion region, the higher the magnitude of variations in voltages. This relationship is expressed by the following equation.

$$\Delta V = \Delta Q / C \qquad \text{Eq. 1}$$

Referring to the Eq. 1, in case that a value of C is a small value, a magnitude of variations ($\Delta V$) increases even though an amount of charges ($\Delta Q$) is small. That is, if the capacitance (C) of the floating diffusion region is low, it is possible to effectively drive the drive transistor Dx even if the amounts of charges ($\Delta Q$) is small. As a result, the dynamic ranges of the image sensor increases.

In order to lower the capacitance of the floating diffusion region, the transfer transistor Tx and the reset transistor Rx use a depletion mode NMOS transistor. The drive transistor Dx and the select transistor Sx are typical NMOS transistors.

The transfer transistor Tx and the reset transistor Rx, I.e., the depletion mode NMOS transistors, do not need to have a lightly doped drain (LDD) structure. For this reason, the capacitance of a junction between a gate of the transfer transistor Tx, a gate of the reset transistor Rx and the floating diffusion region is decreased, and thus, the drive transistor Dx can be effectively driven. Consequently, the dynamic range of the image sensor increases.

Also, the depletion mode transistor has a negative threshold voltage. Therefore, if the transfer transistor Tx and the reset transistor Rx are constructed with the depletion mode transistors, it is possible to reduce a voltage descent resulted from the threshold voltage during the reset operation.

In addition to the above method, there is another method for increasing the dynamic range through an increase of the photodiode capacitance. That is, the photodiode capacitance is augmented by increasing a volume and an area of the photodiode.

In the course of progression to the micronization of the image sensor, the photodiode area is also decreased. To compensate the decrease of the dynamic range resulted from the decrease of the photodiode area, there is suggested another method of constructing a vertically deep photodiode structure.

However, in case of forming the deep photodiode, a distance between the neighboring photodiodes becomes narrower, and thereby increasing incidences of a cross-talk phenomenon or a leakage current phenomenon.

FIG. 1B is a cross-sectional view of a unit pixel of an image sensor including a photodiode and a transfer transistor Tx. Particularly, FIG. 1B is to show the leakage current and the cross-talk phenomena when the deep photodiode is formed. In FIG. 1B, a gate electrode of the transfer transistor Tx is only illustrated. Also, the photodiode shown in FIG. 1B is a p/n/p type.

As shown, a p-type epi layer 11 epitaxially grown is formed on a highly concentrated p-type substrate 10. A device isolation layer 12 for isolating devices is formed in a surface of the p-type epi-layer 11. The device isolation layer 12 has a trench structure. A channel stop ion implantation region 19 is formed at a bottom surface of the device isolation layer 12.

Also, a gate electrode 13 of the transfer transistor Tx is formed on the surface of the p-type epi layer 11, and a spacer 14 is formed at lateral sides of the gate electrode 13.

Within the p-type epi-layer 11, an n-type ion implantation region 15 for the photodiode (hereinafter referred to as photodiode n-type ion implantation region) is deeply formed. A p-type ion implantation region 16 for the photodiode (hereinafter referred to as photodiode p-type ion implantation region) is formed at a portion located between a bottom portion of the p-type epi layer 11 surface and an upper portion of the photodiode n-type ion implantation region 15, whereby the p/n/p type photodiode is formed along with the p-type epi layer 11.

As described above, if the photodiode n-type ion implantation region 15 is deeply formed to compensate the decrease of the dynamic range, the distance between the neighboring pixels gets narrower. Therefore, a frequency of incidences of the cross-talk phenomenon (refer to an arrow marked as a numeral notation 1) and the leakage current phenomenon (refer to an arrow marked as a numeral notation 2) increases.

Accordingly, it is necessary to develop a device isolation method providing an effect of preventing the above cross-talk and the leakage current phenomena.

SUMMARY OF THE INVENTION

It is, therefore, an object of the present invention to provide a method for fabricating an image sensor including a device isolation layer having a trench structure capable of decreasing incidences of a cross-talk or leakage current phenomenon by forming a photodiode in a deep portion of a substrate and forming two channel stop ion implantation regions.

In accordance with an aspect of the present invention, there is provided a method for fabricating an image sensor including a device isolation layer having a trench structure, wherein an image sensor is integrated with a depletion mode transistor and a typical transistor, the method including the steps of: forming sequentially a buffer oxide layer and a pad nitride layer on a substrate; patterning the pad nitride layer and the buffer oxide layer formed on a first region for the depletion mode transistor and a second region for the typical transistor by performing a device isolation mask process and an etch process to form trenches in the first region and the second region; forming a spacer at lateral sides of the trenches; masking the second region to form a high concentration of a first channel stop ion implantation region at a bottom side of the transistor in the first region by using high energy; removing the spacer formed at the lateral sides of the trench in the first and the second regions; masking the second region to form a low concentration of a second channel stop ion implantation region with use of low energy so that the second channel stop ion implantation region encompasses the lateral sides and the bottom side of the trench in the first region; and burying an insulation material into the trenches in the first region and the second region.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, a detailed description on a method for forming a device isolation layer having trench structure will be provided in the following.

Figure 1A:
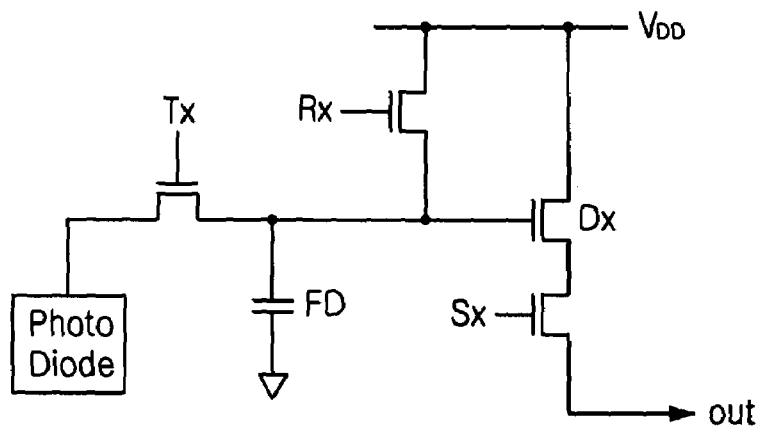
FIG. 1A is a circuit diagram showing a unit pixel of an image sensor employing one photodiode and four transistors.
Figure 1B:
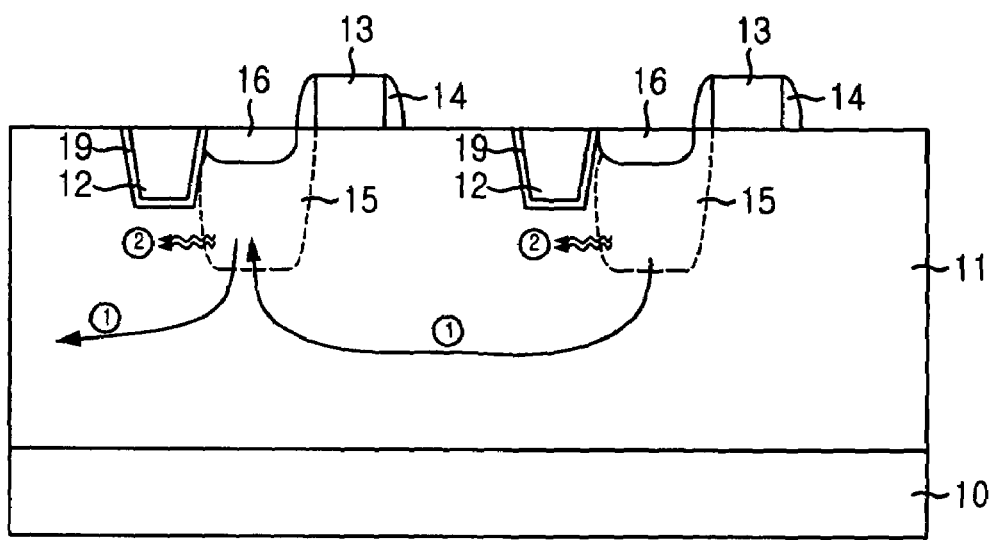
FIG. 1B is an exemplary diagram illustrating a problem arose in the image sensor shown in FIG. 1A.
Figure 2A:
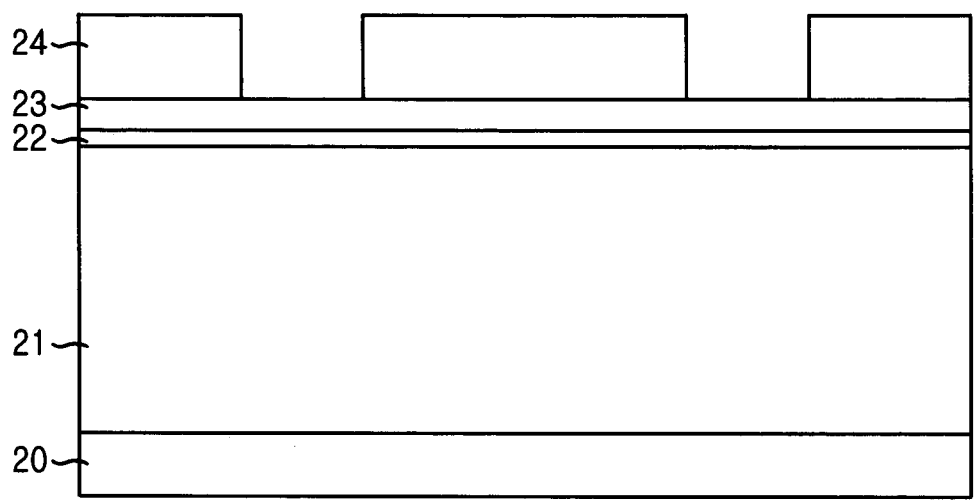
FIGS. 2A to 2E are cross-sectional views showing a method for forming a device isolation layer having a trench structure in accordance with a preferred embodiment of the present invention.

Referring to FIG. 2A, a low concentration of an epitaxially grown p-type epi layer 21 is formed on a highly concentrated p-type substrate 20. The reason for using the low concentration of the p-type epi layer 21 is the following.

First, the low concentration of the p-type epi layer 21 enlarges and deepens a depletion region of a photodiode to thereby enhance a capability of the photodiode for collecting optical charges. Second, if the high concentration of the p-type substrate 20 is formed at a bottom portion of the p-type epi layer 21, optical charges are rapidly recombined prior to be diffused into an adjacent unit pixel. Therefore, it is possible to reduce random diffusion of the optical charges, and thereby further reducing changes in a transfer function of the optical charges.

Next, a buffer oxide layer 22 and a pad nitride layer 23 are sequentially formed on the p-type epi layer 21. A first photosensitive layer 24 is formed on the pad nitride layer 23, and a photo-exposure process is then proceeded thereto. A patterning process that completely removes the buffer oxide layer 22 and the pad nitride layer 23 both formed at a region in which a subsequent device isolation layer will be formed is performed to expose the corresponding region in the p-type epi layer 21. Next, the first photosensitive layer 24 is removed, and the p-type epi layer 21 is etched until reaching a predetermined thickness. At this time, the pad nitride layer 23 is used as an etch mask. From this etch of the p-type epi layer 21, a trench structure for burying the device isolation layer is formed.

Figure 2B:
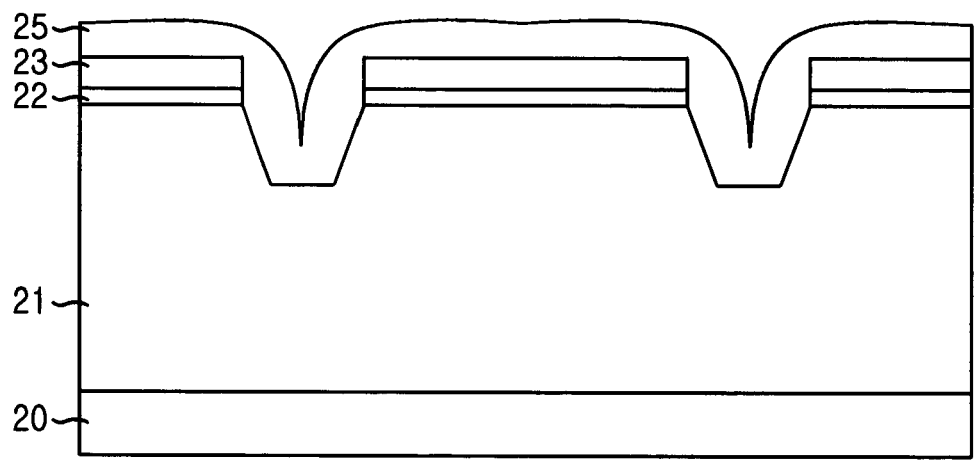

Referring to FIG. 2B, a tetra-ethyl-ortho-silicate (TEOS) oxide layer 25 having a good step coverage is formed on an entire surface of the p-type substrate 20. The TEOS oxide layer 25 is used for forming a spacer at lateral sides of the trench structure. That is, the deposited TEOS oxide layer 25 is blanket-etched to form the spacer at the lateral sides of the trench structure. Hereinafter, the spacer is denoted as a reference numeral 25.

In the present invention, an ion implantation with high energy is used to form a channel stop ion implantation region. Particularly, the channel stop ion implantation region is self-aligned so that it can be allocated in the center of the trench structure with use of the spacer. This specific arrangement prevents degradation of a device characteristic.

Figure 2C:
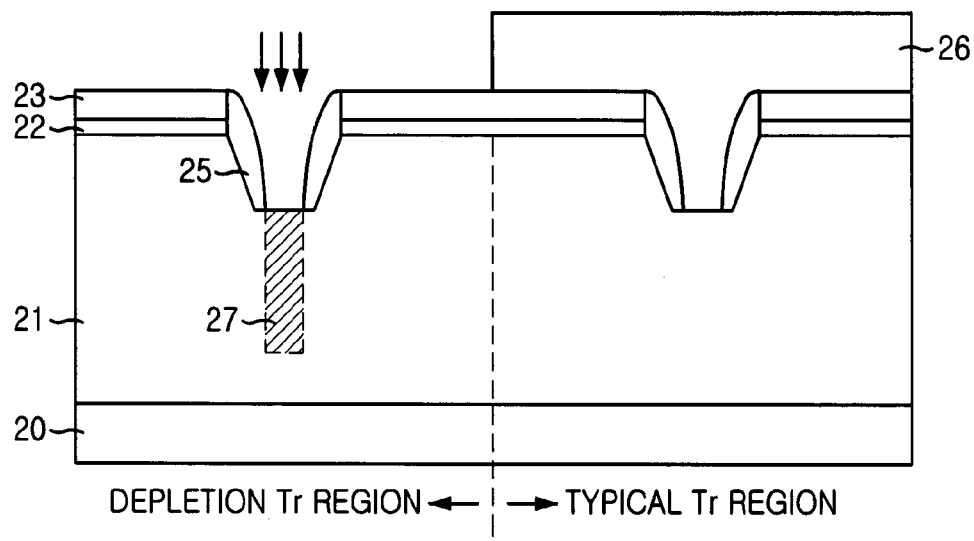

Referring to FIG. 2C, a second photosensitive layer 26 is formed on the above entire structure including the spacer 25. Then, a photo-exposure process and an etch process are performed to remove a predetermined portion of the second photosensitive layer 26 to thereby open a depletion mode transistor region. In the preferred embodiment of the present invention, the second photosensitive layer 26 is used to mask a region in which a typical transistor will be formed. However, it is still possible to perform the mask process using other materials instead of the photosensitive layer 26.

Next, the ion implantation process using high energy (hereinafter referred to as high energy ion implantation process) is applied to lower sides of the trench structure of the depletion mode transistor region so as to form a first channel stop ion implantation region 27. At this time, the high energy ion implantation process employs boron $B_{11}$ of which concentration ranges from about $6.0 \times 10^{12}$ cm$^{-3}$ to about $1.5 \times 10^{13}$ cm$^{-3}$ and uses energy in a range from about 150 KeV to about 250 KeV. There is no tilt angle or rotation in this high energy ion implantation process.

However, in case that an ion implantation mask is misaligned, this high energy ion implantation process could severely damage the substrate or deteriorate a device function. Therefore, the spacer 25 is formed to prevent the deterioration of the device function caused by the misalignment of the ion implantation mask. At this time, both of the pad nitride layer 23 and the second photosensitive layer 26 function to block an ion implantation from being extended to an activation region.

Figure 2D:
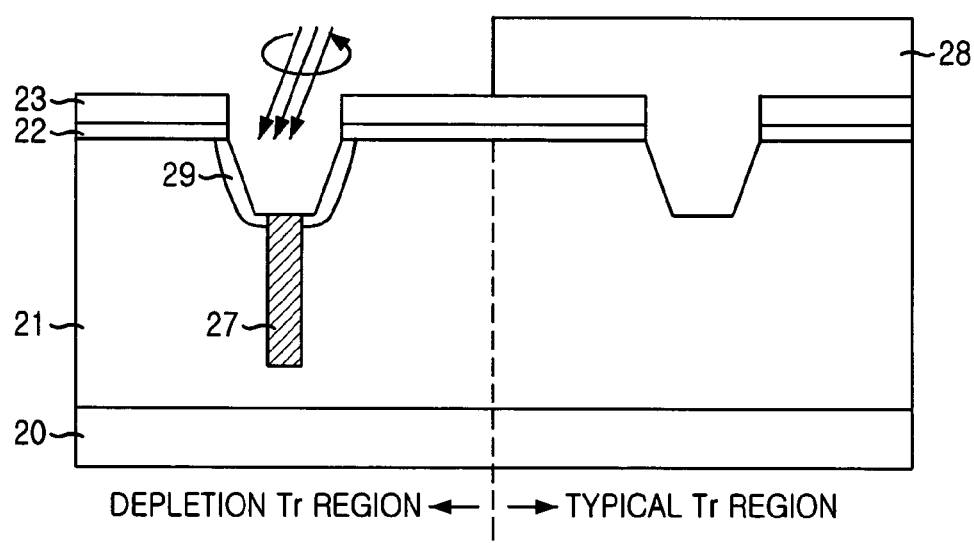

Referring to FIG. 2D, after the second photosensitive layer 26 is removed, the spacer 25 formed at the depletion mode transistor region and the typical transistor region is also removed to bury the device isolation layer 30 into the trench structure.

Subsequent to the removal of the spacer 25, a third photosensitive layer 28 is formed on the above entire structure. A photo-exposure process and an etch process are performed to remove a predetermined portion of the third photosensitive layer 28 so as to expose the depletion mode transistor region. In the preferred embodiment of the present invention, the third photosensitive layer 28 is used to mask the typical transistor region. However, it is still possible to perform the masking process using another material instead of the photosensitive layer.

After the exposure of the depletion mode transistor region, a second channel stop ion implantation region 29 with a trench structure is thinly formed at lateral sides and bottom sides of the trench structure. The ion implantation process uses $B_{11}$ for forming the second channel stop ion implantation region 29. At this time, a concentration of $B_{11}$ is about $6.0 \times 10^{12}$ cm$^{-3}$ and uses energy of about 40 KeV. Also, predetermined tilt angle and rotation are accompanied with the above ion implantation process to form the second channel stop ion implantation region 29 at the lateral sides and the bottom sides of the trench structure. This approach is illustrated in FIG. 2D.

The first channel stop ion implantation region 27 in accordance with the preferred embodiment of the present invention is formed to prevent the current leakage phenomenon and the cross-talk phenomenon between the neighboring unit pixels. The second channel stop ion implantation region 29 is formed to improve characteristics of the image sensor by encompassing a crystalline defect or a dark current source existing at an adhesion region between a field oxide layer 30 and the p-type epi layer 21.

Figure 2E:
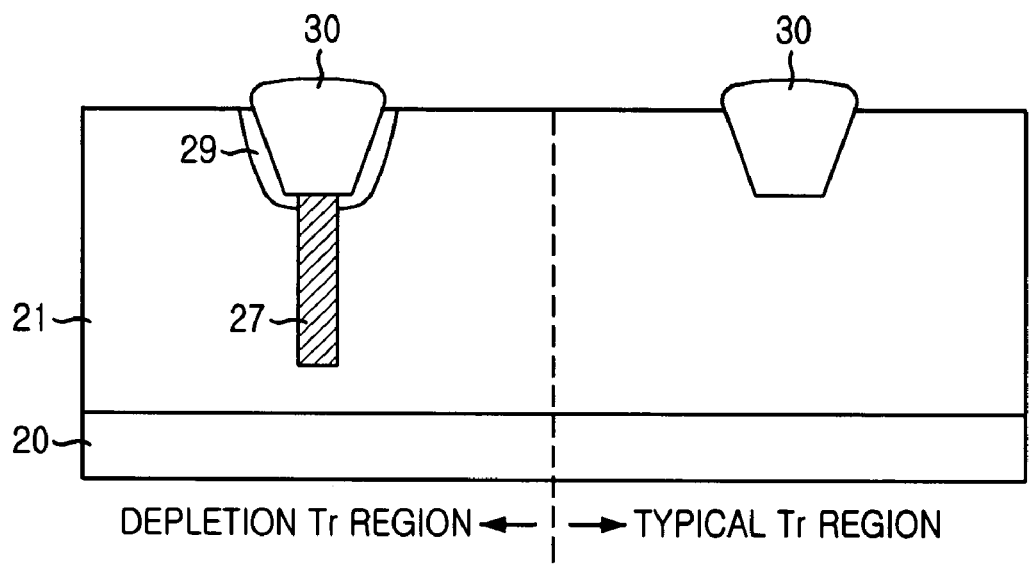

Referring to FIG. 2E, the third photosensitive layer 28 is removed. An insulation layer, e.g., the field oxide layer 30, is filled into the trench structure through a gap-fill process, and an annealing process is performed to obtain a preferable characteristics of the field oxide layer 30. Afterwards, the gap-filled filed oxide layer 30 is planarized through a chemical mechanical polishing process. The pad nitride layer 23 is removed, whereby the device isolation layer formation is completed through a shallow trench isolation (STI) process. Herein, the field oxide layer 30 generally functions as the device isolation layer.

In the preferred embodiment of the present invention, the first and the second channel stop ion implantation regions 27 and 29 are formed at a region where the depletion mode transistor is formed in order to electrically insulate devices from each other. At the region where the typical transistor is formed, a p-well chain ion implantation region electrically insulates the devices from each other.

Figure 3:
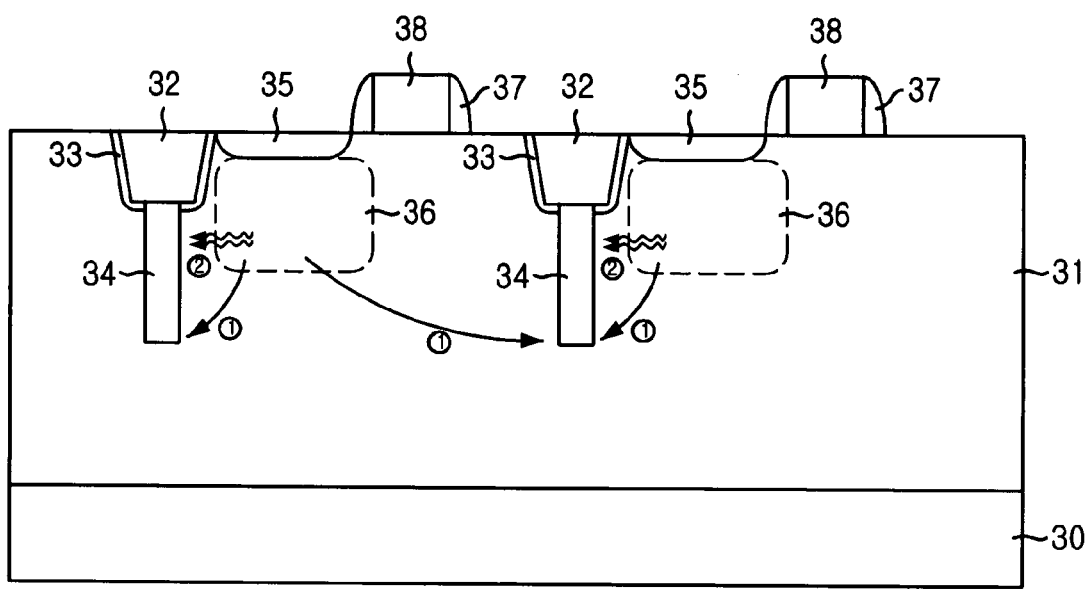
FIG. 3 is a diagram illustrating effects of the present invention.

FIG. 3 is an exemplary diagram illustrating effects achieved by forming a device isolation layer in accordance with the preferred embodiment. A low concentration of a p-type epi layer 31 is formed on a high concentration of an epitaxially grown p-type substrate 30. A device isolation layer 32 having a trench structure is formed in a surface of the p-type epi layer 31. At a bottom portion of the device isolation layer 32, a first channel stop ion implantation region 34 and a second channel stop ion implantation 33 are formed. Specifically, the first channel stop ion implantation region 34 is formed in a deep region of the device isolation layer 32, and the second channel stop ion implantation region 33 is formed at lateral sides and a bottom side of the device isolation layer 32.

Also, a gate electrode 38 of the transfer transistor is formed on the surface of the p-type epi layer 31. A spacer 37 is formed at lateral sides of the gate electrode 38 thereafter.

Inside of the p-type epi layer 31, a photodiode n-type ion implantation region 36 is formed in a deep region of the p-type epi layer 31 to compensate the dynamic range. Then, a photodiode p-type ion implantation region 35 is formed at a portion located between an upper portion of the photodiode n-type ion implantation region 36 and a bottom portion of the p-type epi layer 31 surface, whereby a p/n/p type photodiode along with the p-type epi layer 31 is constructed.

Herein, the first channel stop ion implantation region 34 acts to prevent incidences of the cross-talk phenomenon (an arrow marked as a numeral notation 1) and the leakage current phenomenon (an arrow marked as a numeral notation 2). The second channel stop ion implantation region 33 is formed in such a manner to encompass a crystalline defect or a dark current source existing at an adhesion region between the p-type epi layer 31 and the device isolation layer 32.

The present invention relates to a device isolation method with use of a shallow trench isolation (STI). More specifically, the present invention provides a method for forming a device isolation layer capable of preventing incidences of the leakage current phenomenon and the cross-talk phenomenon between the neighboring unit pixels of the image sensor. Accordingly, the present invention is applicable for high technologies in micronization for proving a micronized line width of around or below about 0.18 μm.

Also, the present invention can still be applicable for a case of using the trench structure of a charge coupled device (CCD) in addition to the CMOS image sensor.

By following the preferred embodiment of the present invention, it is possible to reduce the cross-talk phenomenon without decreasing the dynamic range as well as to improve the leakage current. Furthermore, stability in overall processes can be achieved by employing the spacer during the high energy ion implantation process.

While the present invention has been described with respect to certain preferred embodiments, it will be apparent to those skilled in the art that various changes and modifications may be made without departing from the scope of the invention as defined in the following claims.

What is claimed is:

1. A method for fabricating an image sensor including a device isolation layer having a trench structure, wherein an image sensor is integrated with a depletion mode transistor and a typical transistor, the method comprising the steps of:

forming sequentially a buffer oxide layer and a pad nitride layer on a substrate;

patterning the pad nitride layer and the buffer oxide layer formed on a first region for the depletion mode transistor and a second region for the typical transistor by performing a device isolation mask process and an etch process to form trenches in the first region and the second region;

forming a spacer at lateral sides of the trenches;

masking the second region to form a high concentration of a first channel stop ion implantation region at a bottom side of the transistor in the first region by using high energy;

removing the spacer formed at the lateral sides of the trench in the first and the second regions;

masking the second region to form a low concentration of a second channel stop ion implantation region with use of low energy so that the second channel stop ion implantation region encompasses the lateral sides and the bottom side of the trench in the first region; and burying an insulation material into the trenches in the first region and the second region.

2. The method as recited in claim 1, wherein the first channel stop ion implantation region is formed by employing high energy of about 150 KeV to about 250 KeV and a concentration ranging from about $6.0 \times 10^{12}$ cm$^{-3}$ to about $1.5 \times 10^{13}$ cm$^{-3}$.

3. The method as recited in claim 1, wherein the ion implantation process for forming the second channel stop ion implantation region is performed by giving a tilt angle and a rotation.

4. The method as recited in claim 3, wherein the second channel stop ion implantation region is formed by employing low energy of about 40 KeV and a concentration of about about $6.0 \times 10^{12}$ cm$^{-3}$.

5. The method as recited in claim 2, wherein the first and the second channel stop ion implantation regions are formed by using boron $B_{11}$.

6. The method as recited in claim 1, wherein the spacer is a tetra-ethyl-ortho-silicate (TEOS) oxide layer.

* * * * *